United States Patent
Shibuya (10) Patent No.: US 8,149,054 B2
(45) Date of Patent: Apr. 3, 2012

(54) OPERATIONAL AMPLIFIER (75) Inventor: Masaki Shibuya, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 105 days.

(21) Appl. No.: 12/659,341

(22) Filed: Mar. 4, 2010

(65) Prior Publication Data

US 2010/0244959 A1    Sep. 30, 2010

(30) Foreign Application Priority Data

Mar. 25, 2009    (JP) .................................. 2009-073534

(51) Int. Cl.
*H03F 3/26*    (2006.01)
*H03F 1/14*    (2006.01)
(52) U.S. Cl. ....................................... 330/255; 330/292
(58) Field of Classification Search .................. 330/255, 330/264, 292
See application file for complete search history.

(56) References Cited

U.S. PATENT DOCUMENTS 3,904,972 A * 9/1975 Seki et al. ..................... 330/255
4,570,128 A   2/1986 Monticelli
6,630,863 B2 * 10/2003 Tsuchiya ...................... 330/254

FOREIGN PATENT DOCUMENTS

JP           61-35004           2/1986

* cited by examiner

*Primary Examiner* — Steven J Mottola
(74) *Attorney, Agent, or Firm* — McGinn IP Law Group, PLLC (57) ABSTRACT

An operational amplifier includes a differential amplifier input stage that supplies an operating current to a differential pair, the differential amplifier input stage including a first transistor having a first polarity, a push-pull amplifier output stage that includes a second transistor having the first polarity, and a third transistor having a second polarity, the second transistor and the third transistor being connected in series, and a capacitive element that connects a gate of the first transistor and a gate of the second transistor.

3 Claims, 9 Drawing Sheets

PRIOR ART

OPERATIONAL AMPLIFIER

INCORPORATION BY REFERENCE

This application is based upon and claims the benefit of priority from Japanese patent application No. 2009-073534, filed on Mar. 25, 2009, the disclosure of which is incorporated herein in its entirety by reference.

BACKGROUND

1. Field of the Invention

The present invention relates to an operational amplifier, and more particularly, to an operational amplifier of a drive circuit of an LCD (Liquid Crystal Display) source driver employed in a liquid crystal display.

2. Description of Related Art

An active matrix type liquid crystal display includes scan lines and data lines in a row direction and a column direction, respectively, and pixels are arranged in matrix in intersections of the scan lines with the data lines. An active element (formed by a Thin Film Transistor or the like) is arranged in each of the pixels. A gate electrode of the active element is connected to the scan line, and a drain electrode is connected to the data line. Further, one terminal of a liquid crystal capacitor as an equivalent of a capacitive load is connected to a source electrode of the active element, and the other terminal of the liquid crystal capacitor is connected to a common electrode line. A scan line drive circuit and a data line drive circuit are connected to the scan line and the data line, respectively.

In the liquid crystal display, the scan lines are scanned in series from the top to the bottom by the scan line drive circuit, so as to apply voltage from the data line drive circuit to the liquid crystal capacitor through the active element arranged in each pixel. In the liquid crystal display, the arrangement of the liquid crystal molecules is changed in accordance with the voltage applied to the liquid crystal capacitor, whereby the light transmission ratio varies.

In the known liquid crystal display, the polarity of the voltage that is applied to the liquid crystal capacitor from the data line through the active element (hereinafter referred to as pixel voltage) is inverted at every predetermined period. In summary, the pixels are driven in an alternate manner, and this is because the physical property is degraded while time passes when a certain voltage is applied to the liquid crystal capacitor. Now, the polarity indicates positive or negative of the pixel voltage on the basis of the voltage of the common electrode line of the liquid crystal (Vcom). For example, a dot inversion drive method and a two-line-dot inversion drive method are known as the method of driving the pixels. The dot inversion drive method is the method of inverting the polarity of the pixel voltage every time one scan line is scanned, and the two-line-dot inversion drive method is the method of inverting the polarity of the pixel voltage every time two scan lines are operated.

Recent trend of large liquid crystal displays has brought about increase of the resolution and the display size of the liquid crystal panel. The increase of the resolution and the display size of the liquid crystal panel has brought about increase of the number of data lines and its length to be driven and increase of the number of pixels connected to one data line. This leads to increase of the load of the panel driven by the LCD source driver. Among the characteristic parameters of the output buffer of the LCD source driver, slew rate is the important characteristic parameter to judge visible failures of the image quality. In short, the increase of the load capacitance results in degradation of the slew rate of the output of the LCD source driver. In order to prevent this, characteristic of the slew rate of the output buffer needs to be enhanced in order to drive higher load.

Figure 8:
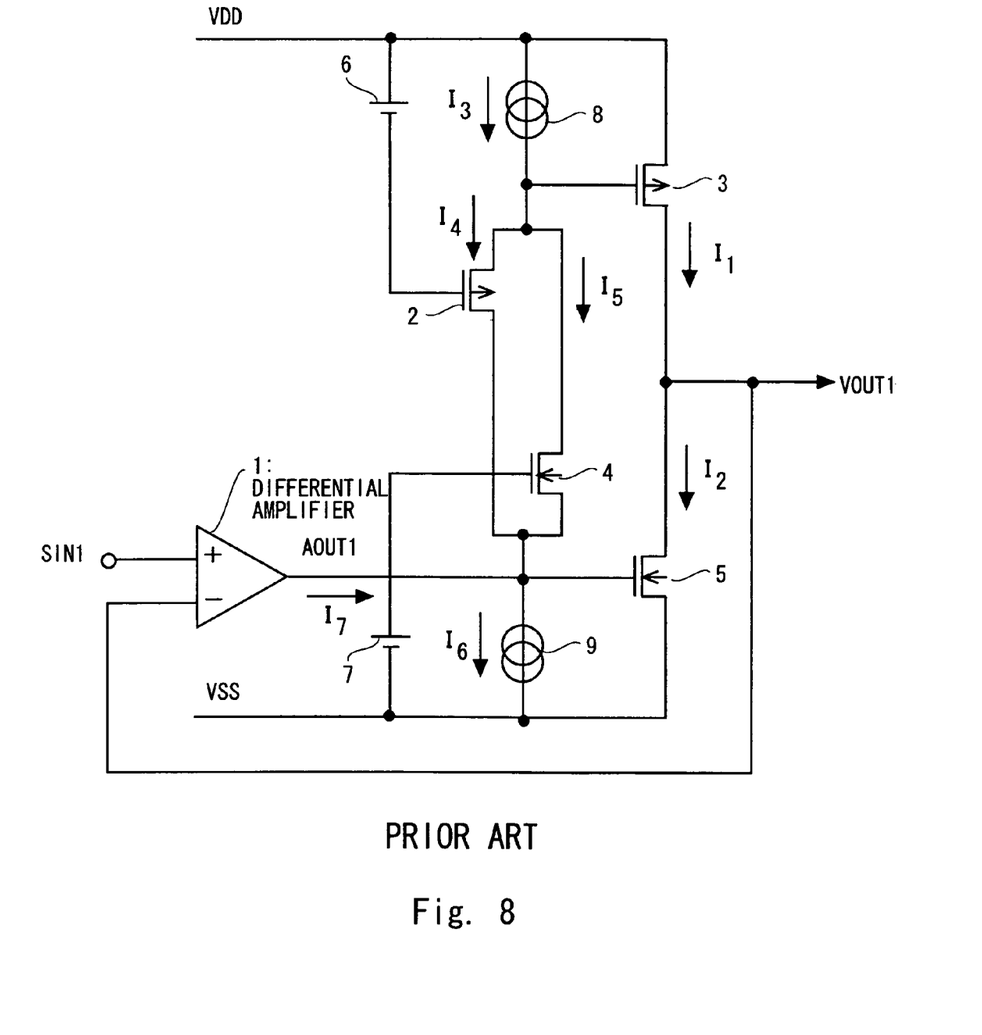
FIG. 8 is a circuit diagram showing a structure of an operational amplifier disclosed in Japanese Unexamined Patent Application Publication No. 61-35004.

FIG. 8 is a circuit diagram showing the structure of an operational amplifier disclosed in Japanese Unexamined Patent Application Publication No. 61-35004. This operational amplifier is a typical amplifier including a class AB output stage that is push-pull driven. This circuit includes a differential amplifier 1, P channel MOS transistors 2, 3, N channel MOS transistors 4, 5, constant voltage sources 6, 7, and constant current sources 8, 9.

An output terminal VOUT1 and a minus input of the differential amplifier 1 are voltage-follower connected. An output AOUT1 of the differential amplifier 1 amplifies an input terminal SIN1 and is connected to a drain of the P channel MOS transistor 2, a source of the N channel MOS transistor 4, a gate of the N channel MOS transistor 5, and the constant current source 9.

The other terminal of the constant current source 9 is connected to a negative voltage power supply VSS. A source of the N channel MOS transistor 5 is connected to the negative voltage power supply VSS, and a drain is connected to the output terminal VOUT1, a drain of the P channel MOS transistor 3, and the minus input of the differential amplifier 1. The P channel MOS transistor 3 includes a source connected to a positive power supply voltage VDD, a gate connected to the constant current source 8, a source of the P channel MOS transistor 2, and a drain of the N channel MOS transistor 4, and a drain connected to the output terminal VOUT1, the drain of the N channel MOS transistor 5, and the minus input of the differential amplifier 1.

The other terminal of the constant current source 8 is connected to the positive voltage power supply VDD. A gate of the P channel MOS transistor 2 is connected to the positive voltage power supply VDD through the constant voltage source 6, and is biased to be lower than the positive voltage power supply VDD by a certain voltage. A gate of the N channel MOS transistor 4 is connected to the negative voltage power supply VSS through the constant voltage source 7, and is biased to be higher than the negative voltage power supply VSS by a certain voltage.

Next, the operation of the circuit shown in FIG. 8 will be described. In FIG. 8, the output terminal VOUT1 in the output stage responds to the input SIN1 of the differential amplifier 1. The P channel MOS transistor 3 and the N channel MOS transistor 5 that are connected in series both flow the same zero input current ($I_1 = I_2$).

The constant current source 8 flows $I_3$ from the positive voltage power supply VDD to a node to which the gate of the P channel MOS transistor 3 is connected. $I_3$ is separated into two parts $I_4$ and $I_5$, and each of them flows to the P channel MOS transistor 2 and the N channel MOS transistor 4, respectively. The P channel MOS transistor 2 and the N channel MOS transistor 4 are complementary transistors connected between the gate of the P channel MOS transistor 3 and the gate of the N channel MOS transistor 5.

The constant current source 9 flows $I_6$ to the negative voltage power supply VSS from a node to which the gate of the N channel MOS transistor 5 is connected. The differential amplifier 1 demodulates current $I_7$ that flows in the constant current source 9 as a part of $I_6$ ($I_6 = I_4 + I_5 + I_7$).

The bias structure that includes the constant current sources 8, 9 operates the P channel MOS transistor 2 and the N channel MOS transistor 4 as common gate unity gain level shifters.

Upon modulating $I_7$ by the differential amplifier 1, the gate potential of the N channel MOS transistor 5 varies, which varies $I_2$. In short, as $I_7$ increases, the gate potential of the N channel MOS transistor 5 increases. Now, as $I_6$ is constant, $I_5$ decreases. This raises the potential of the gate of the P channel MOS transistor 3, which causes reduced $I_1$, and the output terminal VOUT1 attenuates the current as a result. Since the drain of the N channel MOS transistor 4 is connected to the source of the P channel MOS transistor 2, the common gate connection generates unity gain from the gate of the N channel MOS transistor 5 to the gate of the P channel MOS transistor 3.

Meanwhile, $I_5$ increases as the differential amplifier 1 decreases $I_7$. Thus, the gate potential of the N channel MOS transistor 5 is decreased, which decreases $I_2$. The operation of the N channel MOS transistor 4 decreases the gate potential of the P channel MOS transistor 3, which increases $I_1$, and thus the output terminal VOUT1 supplies current as a result. As stated above, the P channel MOS transistor 3 and the N channel MOS transistor 5 are push-pull driven.

Figure 9:
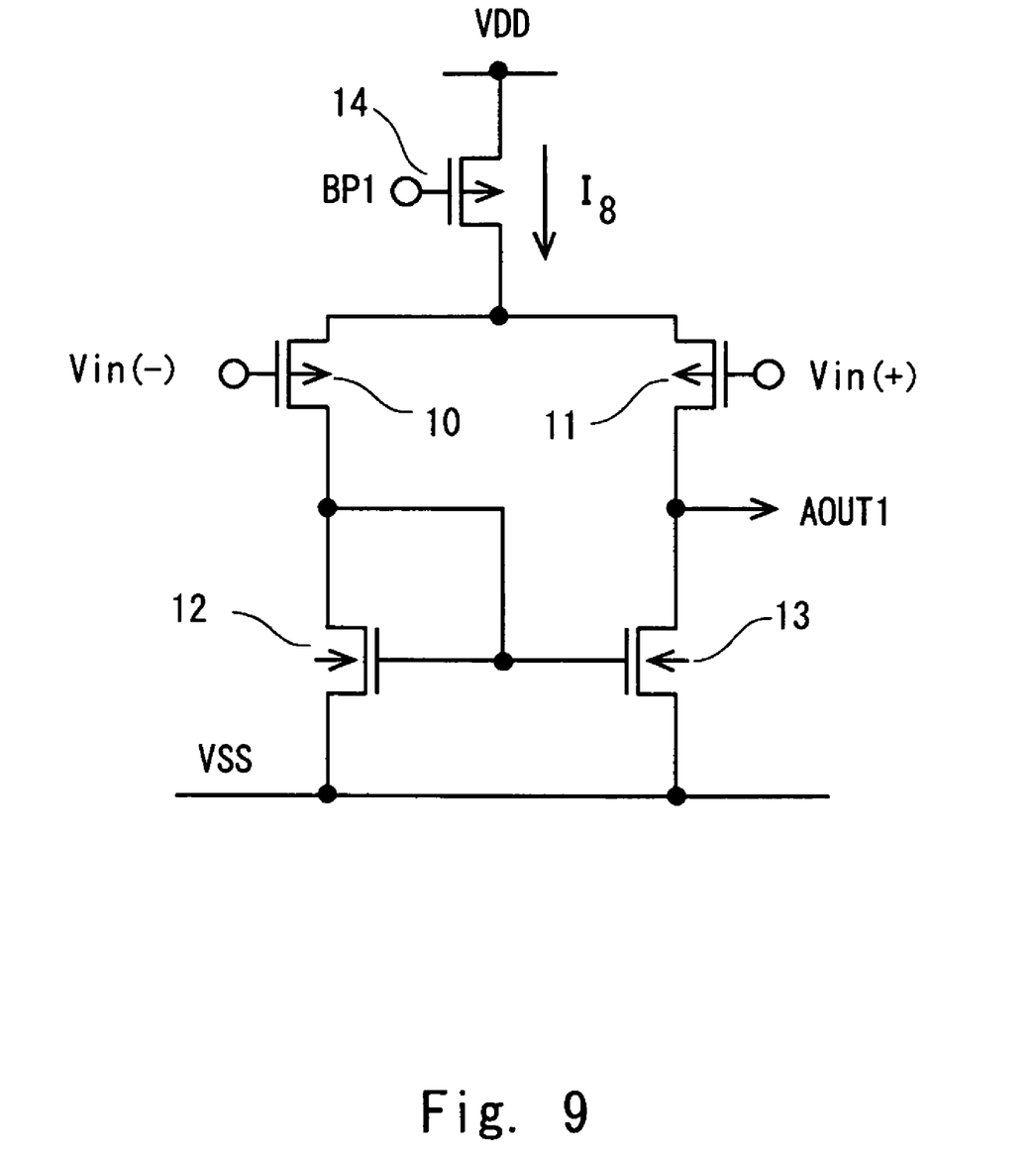
FIG. 9 is a circuit diagram showing a configuration example of a differential amplifier according to the related art.

Next, one example of the differential amplifier is shown in FIG. 9. This differential amplifier includes P channel MOS transistors 10, 11 that form a differential pair, N channel MOS transistors 12, 13 that form a current mirror circuit, and a P channel MOS transistor 14 that functions as a constant current source. Gates of the P channel MOS transistors 10, 11 are connected to an inverting input terminal Vin(−), and a non-inverting input terminal Vin(+), respectively. The inverting input terminal Vin(−) is a minus input of the differential amplifier 1 shown in FIG. 8, and is voltage-follower connected to the output terminal VOUT1. The P channel MOS transistor 14 that functions as the constant current source has a source connected to the positive voltage power supply VDD, a drain connected to sources of the P channel MOS transistors 10, 11, and a gate connected to a bias power supply BP1 to flow constant drain current $I_8$.

The N channel MOS transistor 12 has a source connected to the negative voltage power supply VSS, and a gate and a drain connected to a drain of the P channel MOS transistor 10. The N channel MOS transistor 13 has a source connected to the negative voltage power supply VSS, a gate connected to the gate of the N channel MOS transistor 12, and a drain connected to a drain of the P channel MOS transistor 11. A node in which the drain of the P channel MOS transistor 11 and the N channel MOS transistor 13 are connected is the output terminal AOUT1 of the differential amplifier. The output terminal AOUT1 is the output of the differential amplifier 1, and is connected to the gate of the N channel MOS transistor 5 of the amplifier shown in FIG. 8.

Next, the operation of the differential amplifier shown in FIG. 9 will be described. In the differential amplifier shown in FIG. 9, the differential input signal applied to the inverting input terminal Vin(−) and the non-inverting input terminal Vin(+) is received in the P channel MOS transistors 10, 11 that form a differential pair. An output of the differential pair appears in the drains of the P channel MOS transistors 10, 11. This differential signal is input to the N channel MOS transistors 12, 13 of the current mirror circuit that functions as an active load. The N channel MOS transistors 12, 13 convert the differential output signal to a single end signal. The signal that is converted to the single end signal is the output signal of the amplifier, and is output from the output terminal AOUT1.

SUMMARY

Figure 10:
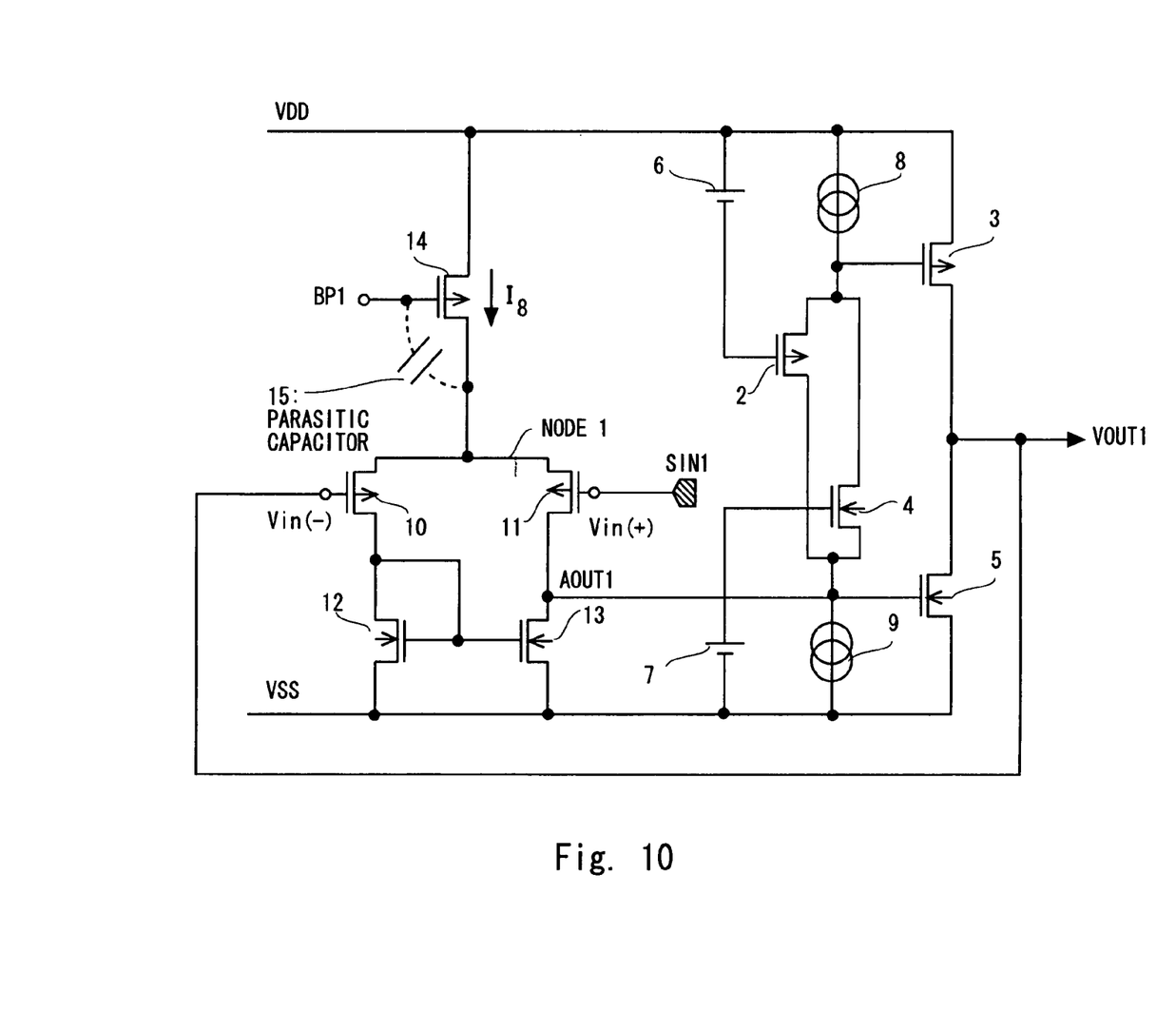
FIG. 10 is a circuit diagram describing a problem solved by the present invention.

FIG. 10 shows a circuit diagram in which the operational amplifier shown in FIG. 8 and the differential amplifier shown in FIG. 9 are combined. At this time, there is a parasitic capacitor 15 between the gate and the drain of the P channel MOS transistor 14.

Figure 11:
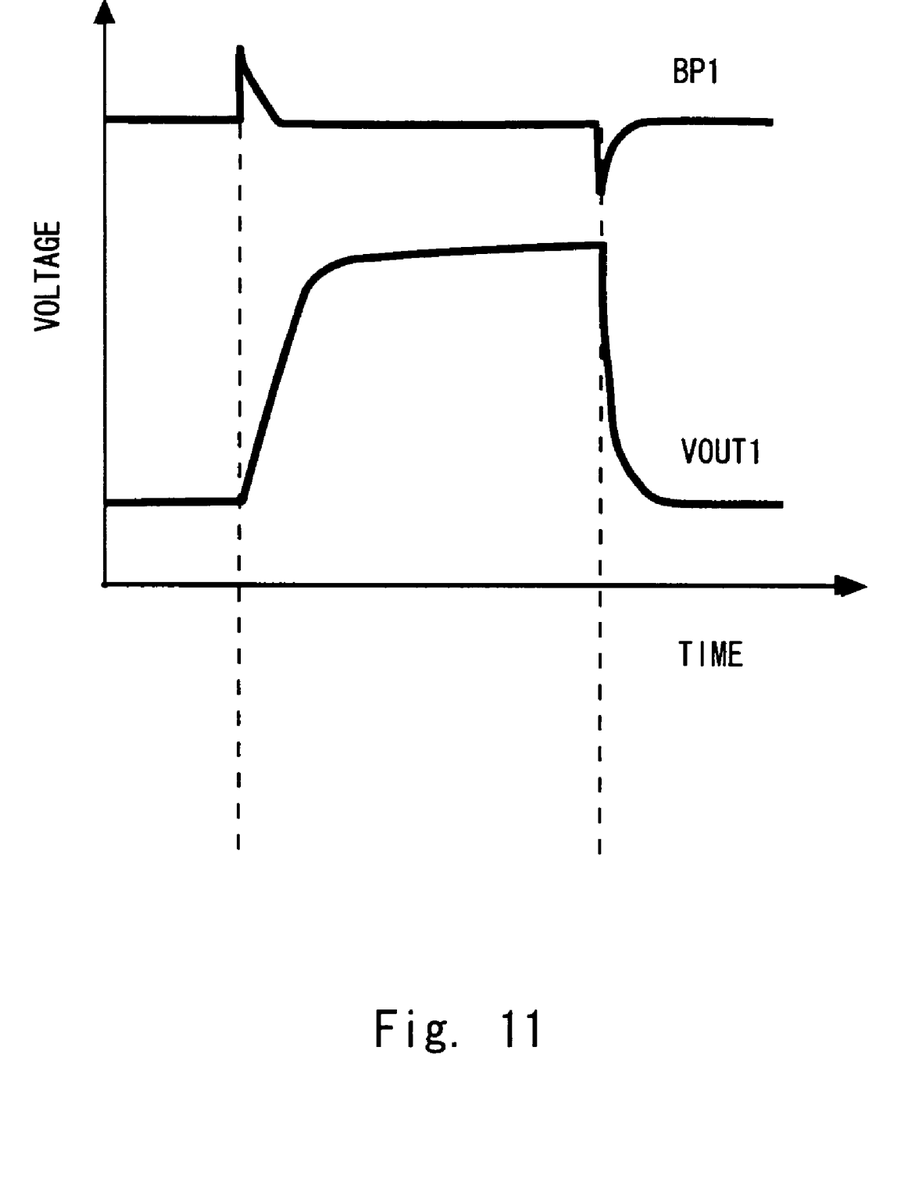
FIG. 11 is a timing chart showing output waveforms in an operational amplifier shown in FIG. 10.

FIG. 11 shows waveforms when a voltage of the output terminal VOUT1 is raised and fallen.

When the voltage of the output terminal VOUT1 is raised, the potentials of the inverting input terminal Vin(−) and the non-inverting input terminal Vin(+) are greatly increased, and thus the potential of the node 1 is increased. Since the potential of the node 1 is increased, the potential of the gate of the P channel MOS transistor 14 (node BP1) is also increased through the parasitic capacitor 15. As the potential of the gate of the P channel MOS transistor 14 is temporarily increased, the potential difference between the gate and the source of the P channel MOS transistor 14 is reduced, the bias current $I_8$ is reduced, and the slew rate is lowered.

In summary, as shown in FIG. 11, when the output terminal VOUT is raised, the potential of the gate of the P channel MOS transistor 14 (node BP1) is raised, and thus the slew rate of VOUT1 is reduced.

On the other hand, when the voltage of the output terminal VOUT1 is fallen, the potentials of the inverting input terminal Vin(−) and the non-inverting input terminal Vin(+) are fallen, and the potential of the node 1 is thus reduced. Since the potential of the node 1 is reduced, the potential of the gate of the P channel MOS transistor 14 is also reduced through the parasitic capacitor 15. As the potential of the gate of the P channel MOS transistor 14 is temporarily reduced, the potential difference between the gate and the source of the P channel MOS transistor 14 is increased, the bias current $I_8$ is increased, which enhances the slew rate.

In summary, in the circuit shown in FIG. 10, although the slew rate is enhanced in the output falling, the bias current is reduced in the rising operation, which reduces the slew rate due to the influence of the parasitic capacitor 15.

For example, in a liquid crystal display, the slew rate in the output rising and that in the falling operation of the LCD source driver are different, and this may cause display failure such as vertical lines or BLOCK DIM.

Although description has been made on the case of the differential amplifier that is formed by the P channel MOS transistor, the slew rate is lowered in the output falling also in the differential amplifier that is formed by an N channel MOS transistor due to the same principle.

A first exemplary aspect of an embodiment of the invention is an operational amplifier including a differential amplifier input stage that supplies an operating current to a differential pair, the differential amplifier input stage including a first transistor having a first polarity, a push-pull amplifier output stage that includes a second transistor having the first polarity, and a third transistor having a second polarity, the second transistor and the third transistor being connected in series, and a capacitive element that connects a gate of the first transistor and a gate of the second transistor.

By employing such a configuration, the voltage fluctuation of the first transistor due to the parasitic capacitor can be suppressed with the voltage fluctuation of the second transistor, whereby the slew rate of the output signal can be enhanced.

A second exemplary aspect of an embodiment of the invention is an operational amplifier including a differential amplifier input stage that supplies an operating current to a differential pair, the differential amplifier input stage comprising a first transistor, a push-pull amplifier output stage that comprises a second transistor and a third transistor connected in series, the second transistor and the third transistor having different polarities, and a capacitive element that connects a gate of the first transistor and a gate of any one of the second transistor and the third transistor. A potential that varies inversely with a potential of an input signal input to the differential amplifier input stage is supplied to a terminal of the capacitive element that is connected to the gate of any one of the second transistor and the third transistor.

According to the present invention, it is possible to enhance the slew rate of the output signal output from the operational amplifier.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Hereinafter, the exemplary embodiments of the present invention will be described with reference to the drawings.

Figure 1:
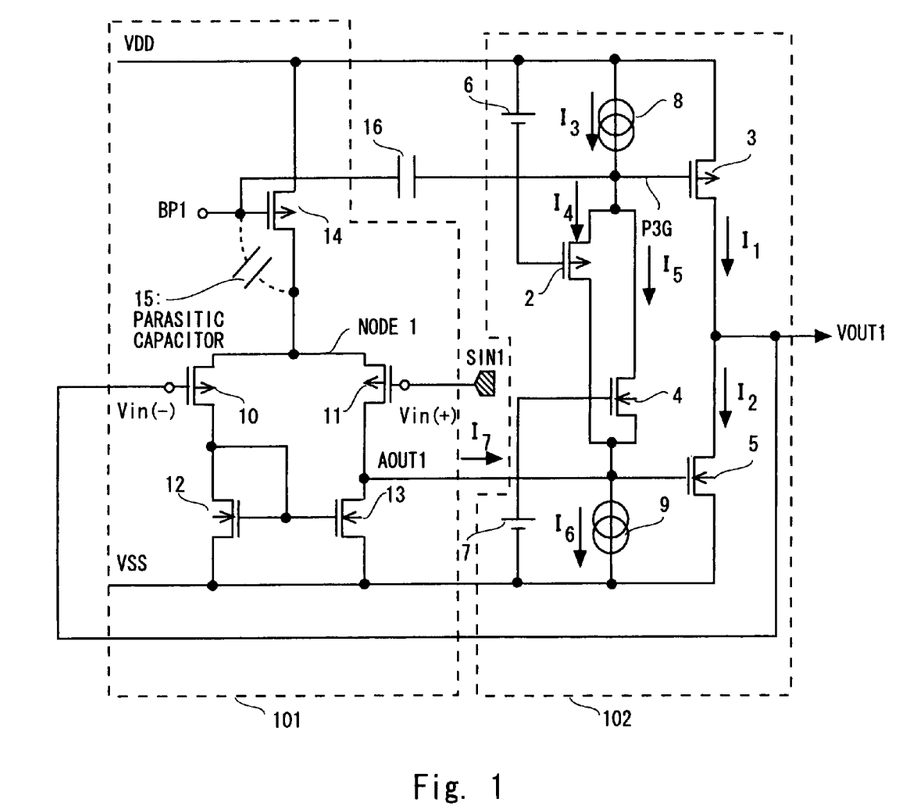
FIG. 1 is a circuit diagram showing an operational amplifier according to a first exemplary embodiment.

FIG. 1 is a circuit diagram of an operational amplifier according to the first exemplary embodiment of the present invention. The circuit shown in FIG. 1 consists of a differential amplifier input stage 101 and a push-pull amplifier output stage 102.

The differential amplifier input stage 101 consists of P channel MOS transistors 10, 11 that form a differential pair, N channel MOS transistors 12, 13 that form a current mirror circuit, and a P channel MOS transistor 14 (first transistor) that functions as a constant current source. Each gate of the P channel MOS transistors 10, 11 is connected to an inverting input terminal Vin(−) and a non-inverting input terminal Vin (+), respectively. The inverting input terminal Vin(−) is voltage-follower connected to an output terminal VOUT1. The P channel MOS transistor 14 that functions as the constant current source has a source connected to a positive voltage power supply VDD, a drain connected to sources of the P channel MOS transistors 10, 11, and a gate connected to a bias power supply BP1 to flow constant drain current.

A source of the N channel MOS transistor 12 is connected to a negative voltage power supply VSS, and a gate and a drain are connected to a drain of the P channel MOS transistor 10. The N channel MOS transistor 13 has a source connected to the negative voltage power supply VSS, a gate connected to the gate of the N channel MOS transistor 12, and a drain connected to a drain of the P channel MOS transistor 11. A node in which the drain of the P channel MOS transistor 11 and the drain of the N channel MOS transistor 13 are connected is an output terminal AOUT1 of the differential amplifier input stage 101. The output terminal AOUT1 is connected to a gate of an N channel MOS transistor 5 of the amplifier.

Next, the push-pull amplifier output stage 102 will be described. The push-pull amplifier output stage 102 includes a P channel MOS transistor 2, a P channel MOS transistor 3 (second transistor), an N channel MOS transistor 4, an N channel MOS transistor 5 (third transistor), constant voltage sources 6, 7, and constant current sources 8, 9.

The output terminal VOUT1 and the inverting input terminal Vin(−) of the differential amplifier input stage 101 are voltage-follower connected. The output AOUT1 of the differential amplifier input stage 101 is connected to a drain of the P channel MOS transistor 2, a source of the N channel MOS transistor 4, the gate of the N channel MOS transistor 5, and the constant current source 9. The other end of the constant current source 9 is connected to the negative voltage power supply VSS.

The N channel MOS transistor 5 has a source connected to the negative voltage power supply VSS, and a drain connected to the output terminal VOUT1, a drain of the P channel MOS transistor 3, and the inverting input terminal Vin(−) of the differential amplifier input stage 101.

The P channel MOS transistor 3 has a source connected to the positive power supply voltage VDD, a gate connected to the constant current source 8, a source of the P channel MOS transistor 2, and a drain of the N channel MOS transistor 4, and a drain connected to the output terminal VOUT1, the drain of the N channel MOS transistor 5, and the inverting input terminal Vin(−) of the differential amplifier input stage 101.

The other terminal of the constant current source 8 is connected to the positive voltage power supply VDD. A gate of the P channel MOS transistor 2 is connected to the positive voltage power supply VDD through the constant voltage source 6, and is biased to be lower than the positive voltage power supply VDD by a certain voltage. A gate of the N channel MOS transistor 4 is connected to the negative voltage power supply VSS through the constant voltage source 7, and is biased to be higher than the negative voltage power supply VSS by a certain voltage.

In the operational amplifier according to the first exemplary embodiment, the gate of the P channel MOS transistor 14 (node BP1) of the differential amplifier input stage 101 and the gate of the P channel MOS transistor 3 (node P3G) that forms the push-pull amplifier output stage 102 are connected through a capacitive element 16.

Now, the MOS transistors that are connected through the capacitive element 16 are formed to have the same polarity. In summary, in the first exemplary embodiment, the polarity of the MOS transistor 14 of the differential amplifier input stage and the polarity of the MOS transistor 3 that forms the push-pull amplifier output stage 102 are formed to be the same (P channel).

Note that the MOS transistors that are connected through the capacitive element 16 may be formed to have opposite polarities. In this case, for example, the gate of the P channel MOS transistor 14 and the gate of the N channel MOS transistor 5 are connected through a capacitive element, and a circuit that inverts the potential is provided between the gate of the MOS transistor 14 and the gate of the MOS transistor 3.

Next, the operation of the operational amplifier shown in FIG. 1 will be described.

In the differential amplifier input stage 101, the differential input signal applied to the inverting input terminal Vin(−) and the non-inverting input terminal Vin(+) is received by the P channel MOS transistors 10, 11 that form a differential pair. The output of the differential pair appears in the drains of the P channel MOS transistors 10, 11. The differential signal is input to the N channel MOS transistors 12, 13 of the current mirror circuit that functions as an active load. The N channel MOS transistors 12, 13 convert the differential output signal to a single end signal. The signal that is converted to the single end signal is the output signal of the amplifier, and is output from the output terminal AOUT1.

Next, the operation of the push-pull amplifier output stage 102 will be described. In the push-pull amplifier output stage 102, the output terminal VOUT1 of the output stage responds to the input SIN1 of the differential amplifier input stage 101. The P channel MOS transistor 3 and the N channel MOS transistor 5 that are connected in series both flow the same zero input current ($I_1=I_2$).

The constant current source 8 flows $I_3$ from the positive voltage power supply VDD to the node to which the gate of the P channel MOS transistor 3 is connected. $I_3$ is separated into two parts $I_4$ and $I_5$, and each of them flows in the P channel MOS transistor 2 and the N channel MOS transistor 4, respectively. The P channel MOS transistor 2 and the N channel MOS transistor 4 are complementary transistors that are connected between the gates of the P channel MOS transistor 3 and the N channel MOS transistor 5.

The constant current source 9 flows $I_6$ to the negative voltage power supply VSS from a node to which the gate of the N channel MOS transistor 5 is connected. The differential amplifier input stage 101 demodulates current $I_7$ that flows in the constant current source 9 as a part of $I_6$ ($I_6=I_4+I_5+I_7$).

The bias structure that includes the constant current sources 8, 9 operates the P channel MOS transistor 2 and the N channel MOS transistor 4 as common gate unity gain level shifters.

When the differential amplifier input stage 101 modulates $I_7$, the gate potential of the N channel MOS transistor 5 is changed, which changes $I_2$. In summary, as $I_7$ increases, the gate potential of the N channel MOS transistor 5 is increased. Now, as $I_6$ is constant, $I_5$ is decreased. As this increases the potential of the gate of the P channel MOS transistor 3, $I_1$ is decreased, and the output terminal VOUT1 attenuates the current as a result. As the drain of the N channel MOS transistor 4 is connected to the source of the P channel MOS transistor 2, the common gate connection generates the unity gain from the gate of the N channel MOS transistor 5 to the gate of the P channel MOS transistor 3.

On the other hand, $I_5$ is increased as the differential amplifier input stage 101 decreases $I_7$. Accordingly, the gate potential of the N channel MOS transistor 5 is decreased, which decreases $I_2$. The operation of the N channel MOS transistor 4 reduces the gate potential of the P channel MOS transistor 3, which increases $I_1$, and the output terminal VOUT1 supplies current as a result. As stated above, the P channel MOS transistor 3 and the N channel MOS transistor 5 are push-pull driven.

Note that the operations of the differential amplifier input stage 101 and the push-pull amplifier output stage 102 are similar to those described with reference to FIGS. 8 and 9.

Figure 2:
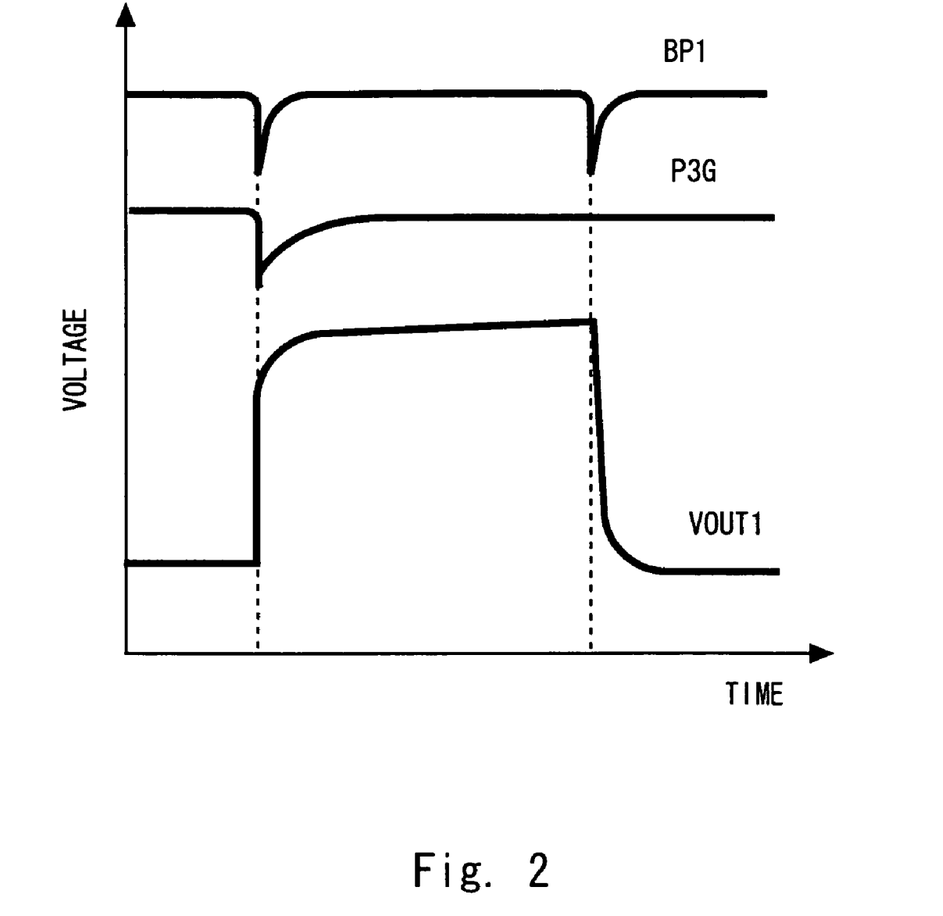
FIG. 2 is a timing chart showing output waveforms of the operational amplifier according to the first exemplary embodiment.

Referring next to FIGS. 1 and 2, rising and falling of VOUT1 will be described. FIG. 2 is a diagram showing output waveforms of the operational amplifier according to the first exemplary embodiment, and each shows relation between time and voltage of BP1, P3G, VOUT1.

When the voltage of the output terminal VOUT1 is raised, the potentials of the inverting input terminal Vin(−) and the non-inverting input terminal Vin(+) are greatly increased, and the potential of the node 1 is thus increased. As the potential of the node 1 is raised, the gate potential of the P channel MOS transistor 14 is also increased through the parasitic capacitor 15.

On the other hand, when the voltage of the output terminal VOUT1 is fallen, the gate potential of the P channel MOS transistor 3 (node P3G) of the push-pull amplifier output stage 102 is decreased. At this time, the gate of the P channel MOS transistor 14 (node BP1) of the differential amplifier input stage 101 and the gate of the P channel MOS transistor 3 (node P3G) that forms the push-pull amplifier output stage 102 are connected through the capacitive element 16.

In this case, the gate potential of the P channel MOS transistor 14 (node BP1) is fallen through the capacitive element 16. Hence, the gate potential of the P channel MOS transistor 14 is made lower than a case in which the P channel MOS transistor 3 and the P channel MOS transistor 14 are not connected.

In summary, it is possible to decrease the gate potential of the P channel MOS transistor 14 by applying the inverse potential (potential that varies inversely with the input signal SIN1 input to the differential amplifier input stage 101) to the gate of the P channel MOS transistor 14 in which the potential is raised due to the parasitic capacitor 15 using the gate of the P channel MOS transistor 3 (node P3G).

At this time, the potential that varies inversely with the potential of the input signal SIN1 input to the differential amplifier input stage 101 is supplied to the terminal of the capacitive element 16 in the side that is connected to the gate of the P channel MOS transistor 3 (node P3G).

Accordingly, the potential difference between the gate and the source of the P channel MOS transistor 14 of the constant current source can be increased, and the bias current value is increased, which realizes the high slew rate.

Comparing FIG. 2 (the P channel MOS transistor 3 and the P channel MOS transistor 14 are connected) with FIG. 11 (the P channel MOS transistor 3 and the P channel MOS transistor 14 are not connected), the node BP1 is increased at rising in FIG. 11. However, the node P3G is decreased at rising in FIG. 2, which means the node BP1 is also decreased. In short, the slew rate in raising the output VOUT1 is enhanced in FIG. 2 compared with the case of FIG. 11.

On the other hand, when the voltage of the output terminal VOUT1 is fallen, the potentials of the inverting input terminal Vin(−) and the non-inverting input terminal Vin(+) are fallen, and the potential of the node 1 is thus decreased. As the potential of the node 1 is decreased, the potential of the gate of the P channel MOS transistor 14 (node BP1) is also decreased through the parasitic capacitor 15. As the potential of the gate of the P channel MOS transistor 14 is temporarily decreased, the potential difference between the gate and the source of the P channel MOS transistor 14 is increased, the bias current is increased, and the slew rate is enhanced. At this time, as the gate potential of the P channel MOS transistor 3 (node P3G) at the output stage does not vary, the capacitive element 16 does not give any influence on the gate potential of the P channel MOS transistor 14 (node BP1) of the constant current source of the differential amplifier input stage 101.

According to the first exemplary embodiment of the present invention, the lowering of the slew rate in raising the output can be enhanced without impairing enhancement of the slew rate in falling the output by the parasitic capacitor 15 by arranging the capacitive element 16 between the gate of the P channel MOS transistor 3 of the push-pull amplifier output stage 102 and the gate of the P channel MOS transistor 14 of the constant current source of the differential amplifier input stage 101.

In summary, according to the first exemplary embodiment of the present invention, it is possible to prevent the current value of the constant current source of the differential amplifier input stage 101 from being made smaller and to prevent property degradation caused by lowering of the slew rate of the output signal when the output signal from the push-pull amplifier output stage 102 varies.

Note that, in the first exemplary embodiment, the level shift circuit (formed by the constant current sources 8, 9, the P channel MOS transistor 2, the N channel MOS transistor 4) is provided that outputs the differential output voltage to the push-pull amplifier output stage 102 through level shift, and the push-pull amplifier is driven based on the differential output voltage and the level-shifted voltage. However, the level shift circuit is not necessarily provided in the first exemplary embodiment of the present invention, but may be omitted as appropriate. When the level shift circuit is omitted, the push-pull amplifier is driven based on the differential output voltage.

Further, even when the capacity of the capacitive element 16 that connects the gate of the P channel MOS transistor 14 (node BP1) and the gate of the P channel MOS transistor 3 (node P3G) is small, a sufficient effect can be obtained.

Figure 5:
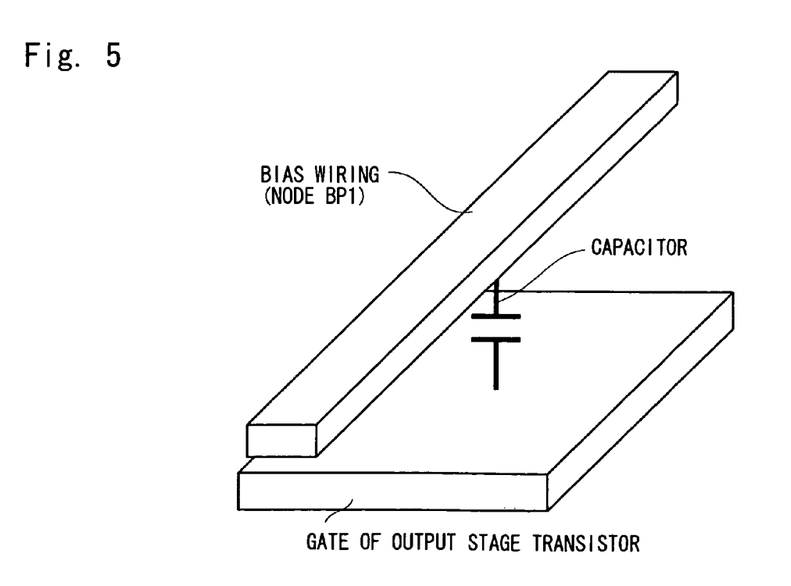
FIG. 5 is a diagram showing a layout example of a gate of an output stage transistor and a bias wiring of the operational amplifier according to the present invention.

For example, as shown in FIG. 5, by capacitively coupling the bias wiring (node BP1) and the gate of the output stage transistor (P channel MOS transistor 3) by the layout, the slew rate may be enhanced without increasing the layout area.

Figure 6:
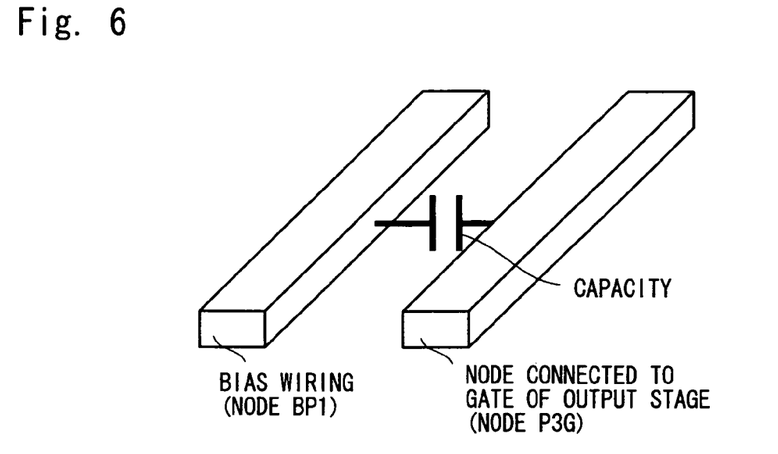
FIG. 6 is a diagram showing a layout example of a node connected to a gate of an output stage transistor and a bias wiring of the operational amplifier according to the present invention.
Figure 7:
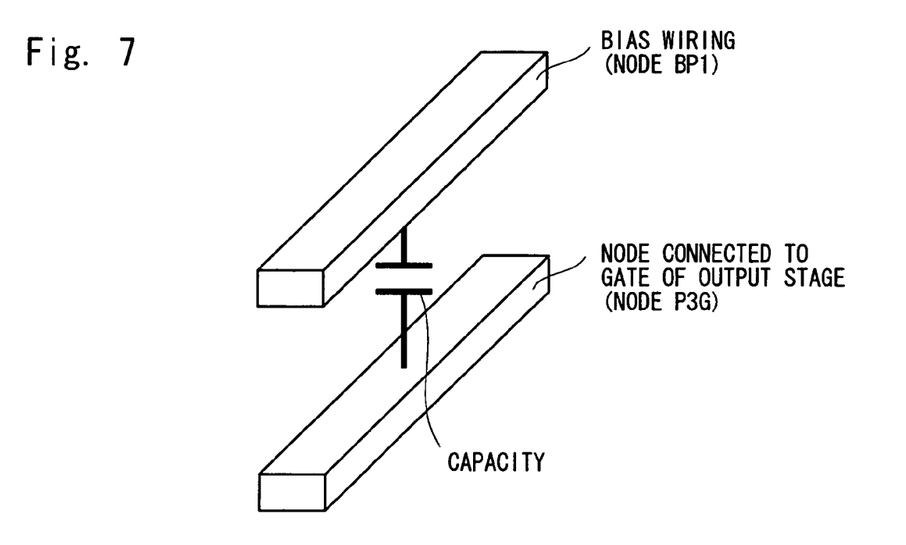
FIG. 7 is a diagram showing a layout example of a node connected to a gate of an output stage transistor and a bias wiring of the operational amplifier according to the present invention.

Further, for example, as shown in FIGS. 6 and 7, by capacitively coupling the bias wiring (node BP1) and the node (P3G) connected to the gate of the output stage transistor (P channel MOS transistor 3) by the layout, the slew rate may be enhanced without increasing the layout area.

[Second Exemplary Embodiment]

Figure 3:
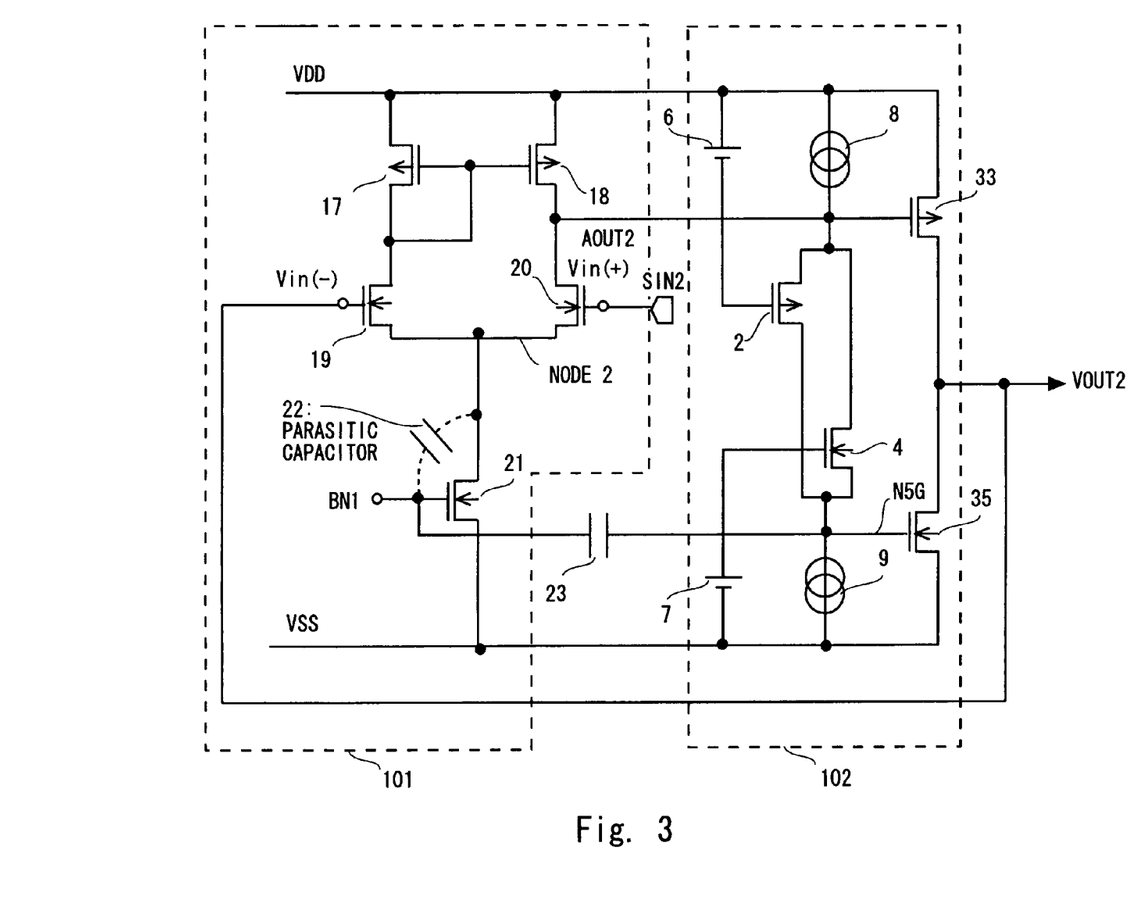
FIG. 3 is a circuit diagram showing an operational amplifier according to a second exemplary embodiment.

FIG. 3 is a circuit diagram of an operational amplifier according to the second exemplary embodiment of the present invention. The circuit shown in FIG. 3 also consists of the differential amplifier input stage 101 and the push-pull amplifier output stage 102, as is similar to the circuit shown in FIG. 1. In FIG. 3, the components identical to those shown in FIG. 1 are denoted by the same reference symbols, and description thereof will be omitted.

FIG. 3 is different from FIG. 1 in that the differential pair of the differential amplifier input stage 101 consists of N channel MOS transistors 19, 20, the current mirror circuit consists of P channel MOS transistors 17, 18, and a transistor 21 (first transistor) that functions as the constant current source consists of an N channel MOS transistor. At this time, a gate of the N channel MOS transistor 21 is connected to a gate of an N channel transistor 35 (second transistor) through a capacitive element 23. Further, an output terminal AOUT2 is connected to a gate of a P channel transistor 33 (third transistor).

Figure 4:
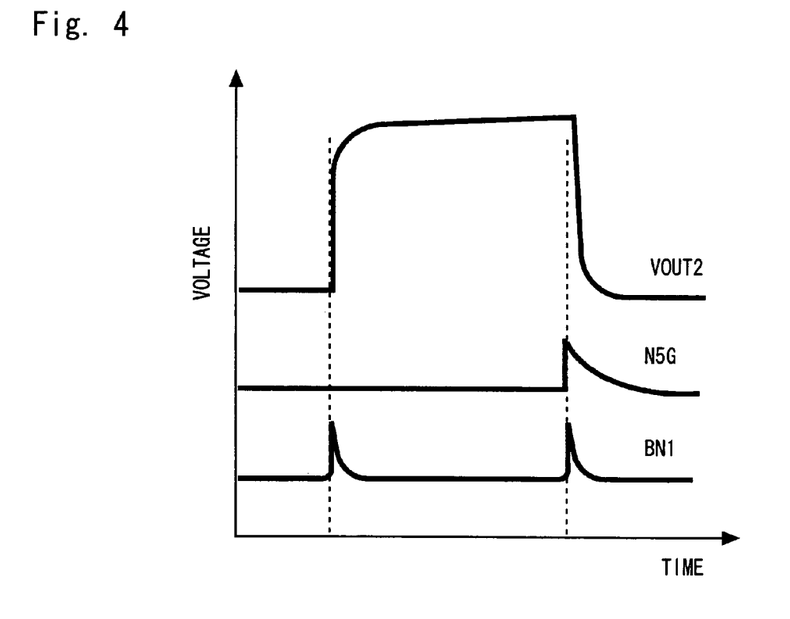
FIG. 4 is a timing chart showing output waveforms of the operational amplifier according to the second exemplary embodiment.

In short, in the operational amplifier according to the second exemplary embodiment of the present invention, the differential amplifier that receives the inverting input terminal Vin(−) and the non-inverting input terminal Vin(+) in the N channel MOS transistors is used instead of the differential amplifier according to the first exemplary embodiment. Further, the output of the differential amplifier is connected to the gate of the P channel MOS transistor 33 of the push-pull amplifier output stage 102 in the second exemplary embodiment. The operation according to the second exemplary embodiment is as shown in FIG. 4, which means it is opposite to that of the first exemplary embodiment.

The differential amplifier input stage 101 of the operational amplifier according to the second exemplary embodiment of the present invention will be described.

Gates of the N channel MOS transistors 19, 20 are connected to the inverting input terminal Vin(−) and the non-inverting input terminal Vin(+), respectively. The inverting input terminal Vin(−) is voltage-follower connected with the output terminal VOUT2. The N channel MOS transistor 21 that functions as the constant current source has a source connected to the negative voltage power supply VSS, a drain connected to sources of the N channel MOS transistors 19, 20, and a gate connected to a bias power supply BN1 to flow constant drain current.

The P channel MOS transistor 17 has a source connected to the positive voltage power supply VDD, and a gate and a drain connected to a drain of the N channel MOS transistor 19. The P channel MOS transistor 18 has a source connected to the positive voltage power supply VDD, a gate connected to the gate of the P channel MOS transistor 17, and a drain connected to a drain of the N channel MOS transistor 20. A node in which the drain of the N channel MOS transistor 20 and the P channel MOS transistor 18 are connected is an output terminal AOUT2 of the differential amplifier input stage 101. The output terminal AOUT2 is connected to the gate of the P channel MOS transistor 33 of the amplifier.

Note that the push-pull amplifier of the second exemplary embodiment is identical to that of the first exemplary embodiment, and thus description thereof will be omitted.

Referring next to FIGS. 3 and 4, rising and falling of VOUT2 will be described. FIG. 4 is a diagram showing output waveforms of the operational amplifier according to the second exemplary embodiment, and each shows relation between time and voltage of BN1, N5G, and VOUT2.

When the voltage of the output terminal VOUT2 is raised, the potentials of the inverting input terminal Vin(−) and the non-inverting input terminal Vin(+) are raised, and the potential of the node 2 is thus raised. Since the potential of the node 2 is increased, the potential of the gate of the N channel MOS transistor 21 (node BN1) is also increased through a parasitic capacitor 22. As the potential of the gate of the N channel MOS transistor 21 is temporarily raised, the potential difference between the gate and the source of the N channel MOS transistor 21 is increased, the bias current is increased, which enhances the slew rate. At this time, as the gate potential of the N channel MOS transistor 35 (node N5G) of the output stage does not vary, the capacitive element 23 does not give any influence on the gate potential of the P channel MOS transistor 21 (node BN1) of the constant current source of the differential amplifier input stage 101.

On the other hand, when the voltage of the output terminal VOUT2 is fallen, the potentials of the inverting input terminal Vin(−) and the non-inverting input terminal Vin(+) are greatly decreased, and the potential of the node 2 is thus decreased. As the potential of the node 2 is decreased, the potential of the gate of the N channel MOS transistor 21 is also decreased through the parasitic capacitor 22.

Further, the gate potential of the N channel MOS transistor 35 (node N5G) of the push-pull amplifier output stage 102 is raised at a timing at which the voltage of the output terminal VOUT2 is fallen. At this time, the gate of the N channel MOS transistor 21 (node BN1) of the differential amplifier input stage 101 and the gate of the N channel MOS transistor 35 (node N5G) that forms the push-pull amplifier output stage 102 are connected through the capacitive element 23.

Accordingly, in this case, the gate potential of the N channel MOS transistor 21 (node BN1) is raised through the capacitive element 23. Accordingly, the gate potential of the N channel MOS transistor 21 is higher than a case in which the N channel MOS transistor 35 and the N channel MOS transistor 21 are not connected.

In summary, the gate potential of the N channel MOS transistor 21 can be raised by applying inverse potential (potential that varies inversely with the input signal SIN2 input to the differential amplifier input stage 101) to the gate of the N channel MOS transistor 21 in which the potential is fallen due to the parasitic capacitor 22 using the gate of the N channel MOS transistor 35 (node N5G). At this time, the potential that varies inversely with the potential of an input signal SIN2 input to the differential amplifier input stage 101 is supplied to the terminal of the capacitive element 23 that is connected to the gate of the N channel MOS transistor 35 (node N5G).

Accordingly, the potential difference between the gate and the source of the N channel MOS transistor 21 of the constant current source can be increased, the bias current value is increased, and the high slew rate is realized.

According to the second exemplary embodiment of the present invention, it is possible to improve lowering of the slew rate when the output is fallen as stated above without impairing enhancement of the slew rate in raising the output by the parasitic capacitor 22 by arranging the capacitive element 23 between the gate of the N channel MOS transistor 35 of the push-pull amplifier output stage 102 and the gate of the N channel MOS transistor 21 of the constant current source of the differential amplifier input stage 101. Accordingly, the high slew rate can be obtained in any operation of the rising and the falling of the output.

In the second exemplary embodiment, there is provided the level shift circuit (consisted of the constant current sources 8, 9, the P channel MOS transistor 2, and the N channel MOS transistor 4) that outputs the differential output voltage to the push-pull amplifier output stage 102 through level shift, and the push-pull amplifier is driven based on the differential output voltage and the level-shifted voltage. However, the level shift circuit is not necessarily provided in the second exemplary embodiment of the present invention, but may be omitted as appropriate. If the level shift circuit is omitted, the push-pull amplifier is driven based on the differential output voltage.

Further, even when the capacity of the capacitive element 23 that connects the gate of the N channel MOS transistor 21 (node BN1) and the gate of the N channel MOS transistor 35 (node N5G) is small, a sufficient effect can be obtained.

For example, as shown in FIG. 5, by capacitively coupling the bias wiring (node BN1) and the gate of the output stage transistor (N channel MOS transistor 35) by the layout, the slew rate may be improved without increasing the layout area.

Further, for example, as shown in FIGS. 6 and 7, by capacitively coupling the bias wiring (node BN1) and the node (N5G) that is connected to the gate of the output stage transistor (N channel MOS transistor 35) by the layout, the slew rate may be improved without increasing the layout area.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An operational amplifier comprising:
   a differential amplifier input stage that supplies an operating current to a differential pair, the differential amplifier input stage comprising a first transistor having a first polarity;
   a push-pull amplifier output stage that comprises:
      a second transistor having the first polarity; and
      a third transistor having a second polarity, the second transistor and the third transistor being connected in series;
   a capacitive element that connects the gate of the first transistor and a gate of the second transistor,
   wherein the differential pair is formed by P channel MOS transistors,
   wherein the first transistor and the second transistor are formed by P channel MOS transistors,
   wherein the third transistor is formed by an N channel MOS transistor ,and
   wherein a negative potential is supplied from the gate of the second transistor to the gate of the first transistor when an output signal from the differential amplifier input stage is raised.

2. The operational amplifier according to claim 1, wherein the push-pull amplifier output stage further comprises a level shift circuit that outputs a differential output voltage after level-shifting the differential output voltage, and
   wherein the push-pull amplifier output stage is driven based on the differential output voltage and the level-shifted voltage.

3. An operational amplifier comprising:
   a differential amplifier input stage that supplies an operating current to a differential pair, the differential amplifier input stage comprising a first transistor having a first polarity;
   a push-pull amplifier output stage that comprises:
      a second transistor having the first polarity; and
      a third transistor having a second polarity, the second transistor and the third transistor being connected in series;
   a capacitive element that connects the gate of the first transistor and a gate of the second transistor,
   wherein the differential pair is formed by N channel MOS transistors,
   wherein the first transistor and the second transistor are formed by N channel MOS transistors,
   wherein the third transistor is formed by a P channel MOS transistor, and
   wherein a positive potential is supplied from the gate of the second transistor to the gate of the first transistor when an output signal from the differential amplifier input stage is fallen.

* * * * *